(12) United States Patent
Chiou et al.

(10) Patent No.: US 7,173,826 B1
(45) Date of Patent: Feb. 6, 2007

(54) PC CARD ASSEMBLY WITH FRAME HAVING LONGITUDINAL SLOT

(75) Inventors: Ren-Kang Chiou, Fremont, CA (US); Edward W. Lee, Mountain View, CA (US); Kuang-Yu Wang, Saratoga, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 303 days.

(21) Appl. No.: 10/796,311

(22) Filed: Mar. 8, 2004

(51) Int. Cl.
*H05K 1/14* (2006.01)

(52) U.S. Cl. .............. 361/737; 361/715; 361/790; 361/801; 361/802

(58) Field of Classification Search .............. 361/737, 361/715, 752, 790, 801, 802; 174/250, 255
See application file for complete search history.

(56) References Cited

U.S. PATENT DOCUMENTS

| | | | |
|---|---|---|---|
| 5,330,360 A * | 7/1994 | Marsh et al. | 439/76.1 |
| 5,339,222 A * | 8/1994 | Simmons et al. | 361/818 |
| 5,497,297 A * | 3/1996 | Kilmer et al. | 361/737 |
| 5,563,769 A | 10/1996 | MacGregor | |
| 5,891,483 A | 4/1999 | Miyajima | |
| 6,040,622 A | 3/2000 | Wallace | |
| 6,102,743 A | 8/2000 | Haffenden et al. | |
| 6,128,194 A * | 10/2000 | Francis | 361/737 |
| 6,166,913 A | 12/2000 | Fun et al. | |
| D445,096 S | 7/2001 | Wallace | |
| D452,690 S | 1/2002 | Wallace et al. | |
| D452,865 S | 1/2002 | Wallace et al. | |
| D453,934 S | 2/2002 | Wallace et al. | |
| 6,353,534 B1 * | 3/2002 | Chen | 361/684 |
| 6,381,143 B1 | 4/2002 | Nakamura | |
| 6,399,906 B1 | 6/2002 | Sato et al. | |
| 6,410,355 B1 | 6/2002 | Wallace | |
| 6,462,273 B1 | 10/2002 | Corisis et al. | |
| 6,527,188 B1 | 3/2003 | Shobara et al. | |
| 6,624,005 B1 | 9/2003 | DiCaprio et al. | |
| 6,634,561 B1 | 10/2003 | Wallace | |

* cited by examiner

*Primary Examiner*—Elvin Enad
*Assistant Examiner*—Hung S. Bui
(74) *Attorney, Agent, or Firm*—Bever, Hoffman & Harms, LLP; Patrick T. Bever

(57) ABSTRACT

A PC card frame kit for housing a printed circuit board assembly (PCBA) including a board (PCB) and a connector mounted on a back edge of the PCB. The frame kit includes a frame including first and second parallel side rails and an end rail extending between first ends of the first and second side rails. The frame defines an open end and a longitudinal slot for slidably receiving the PCB. Side panels of the PC card frame kit are then snap-coupled onto the frame.

26 Claims, 6 Drawing Sheets

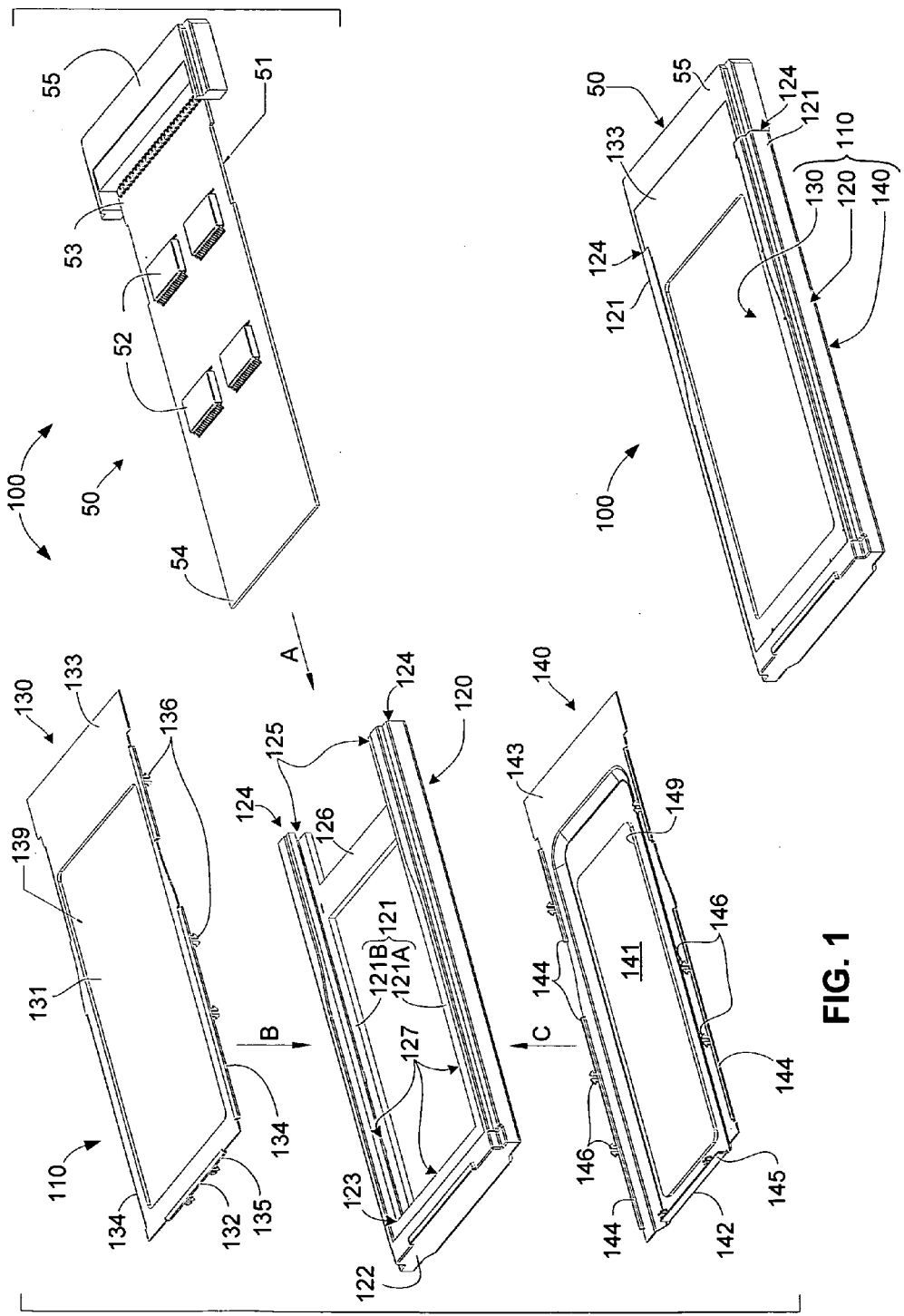

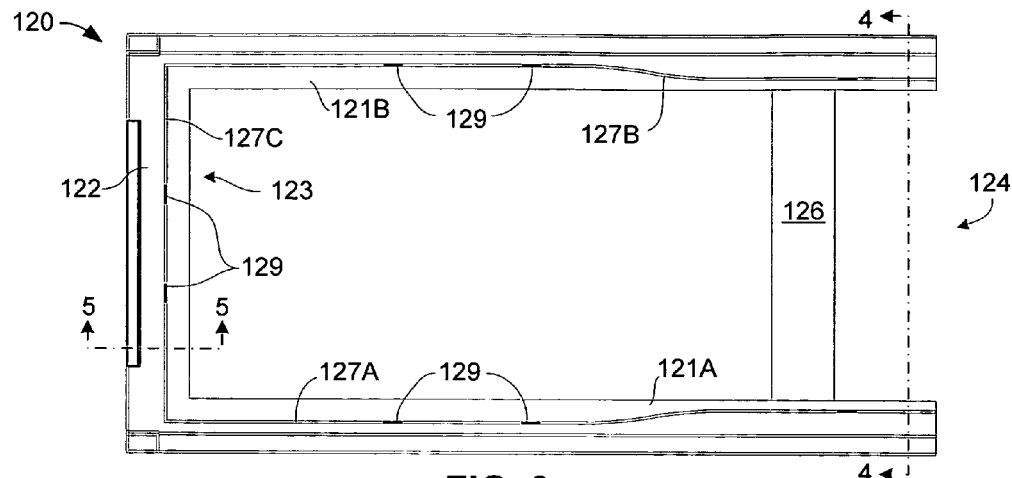
FIG. 3
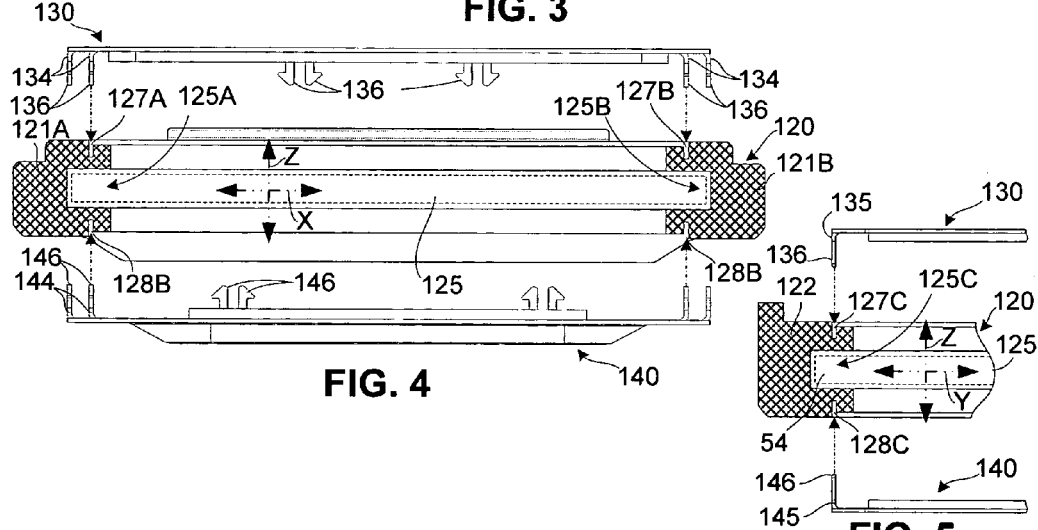
FIG. 4
FIG. 5
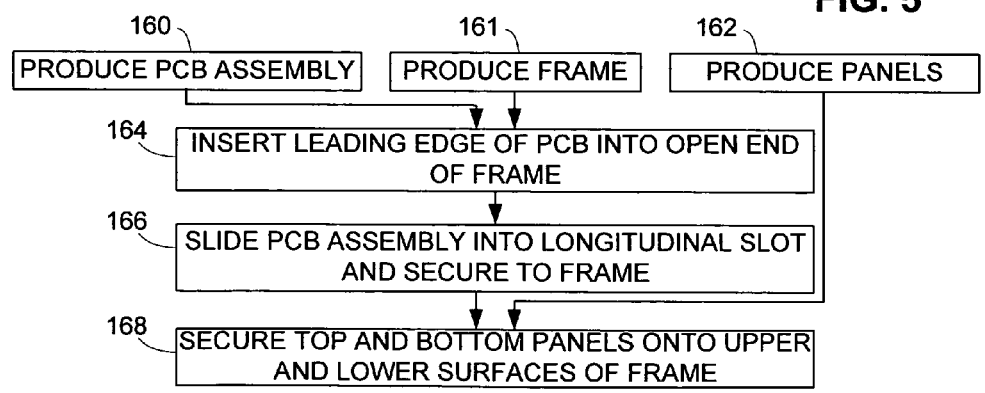
FIG. 6

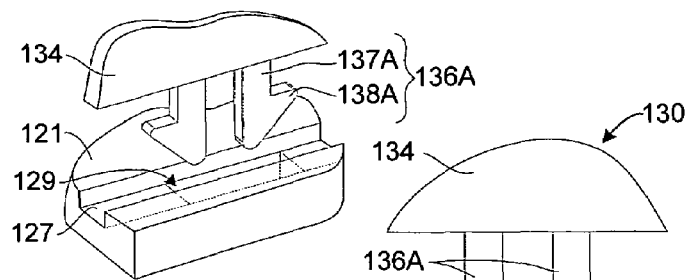
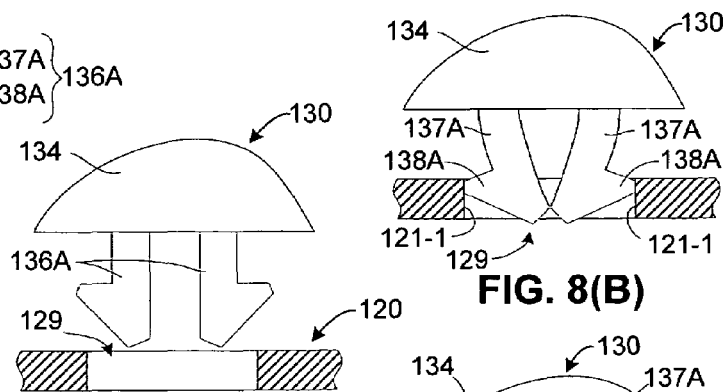
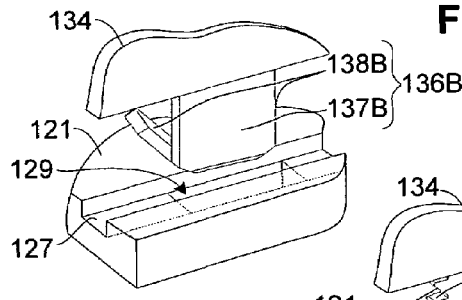
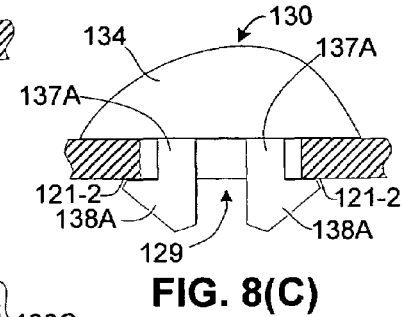
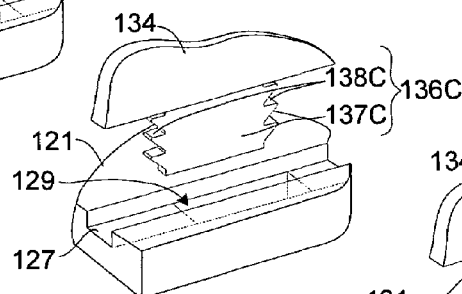
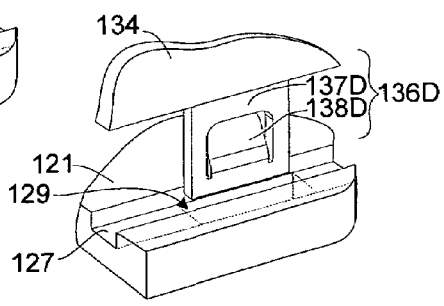
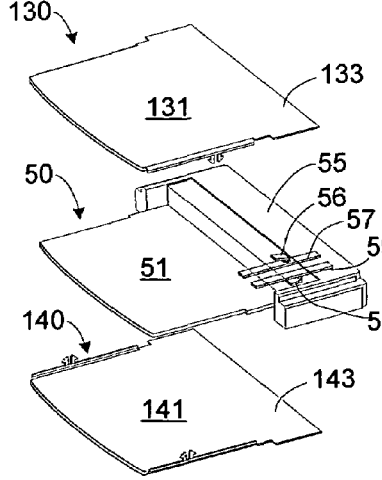
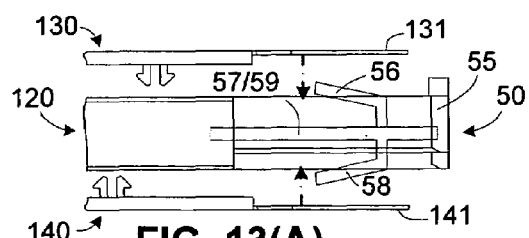
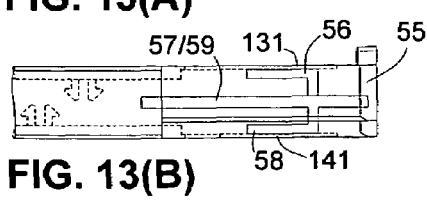

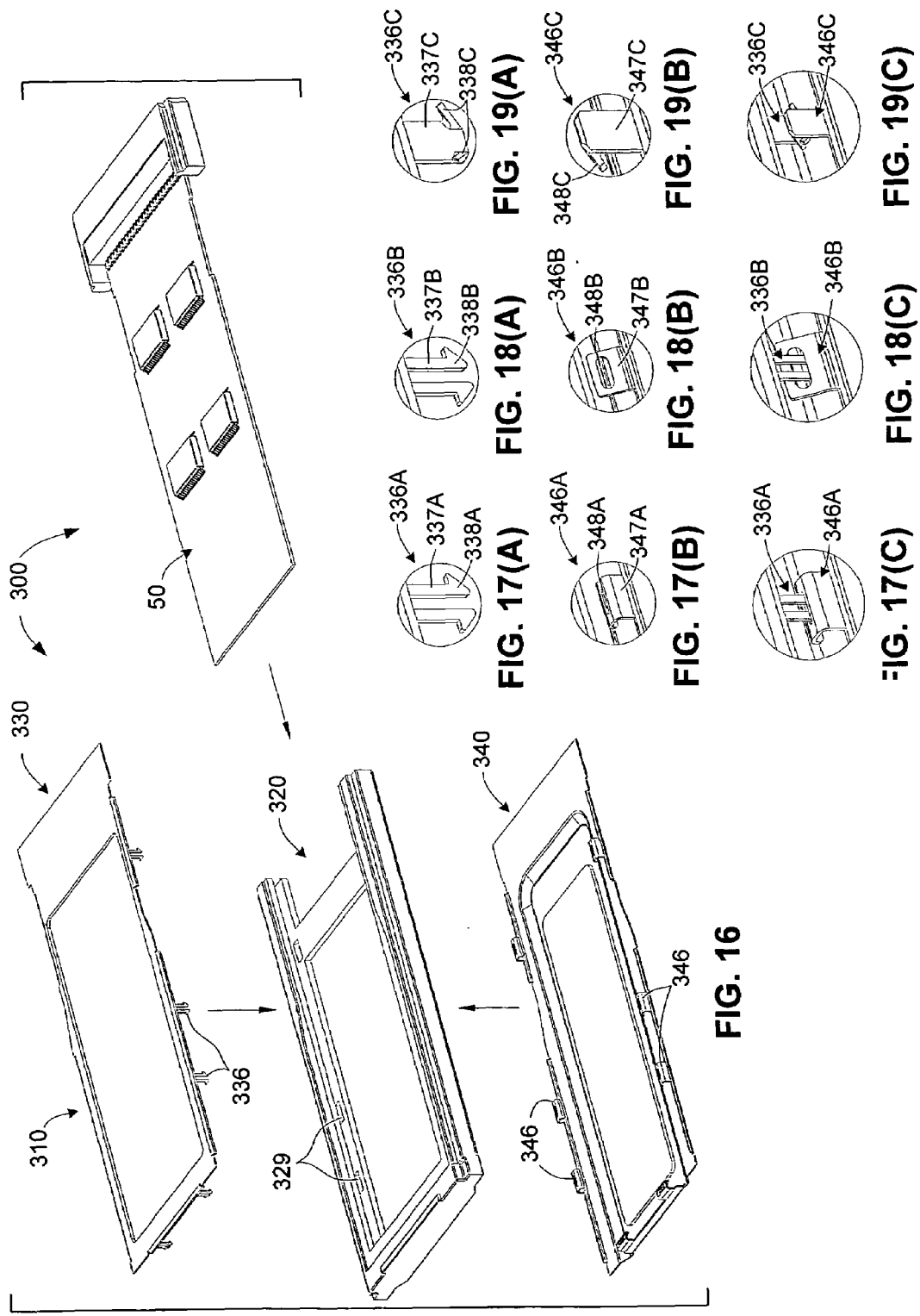

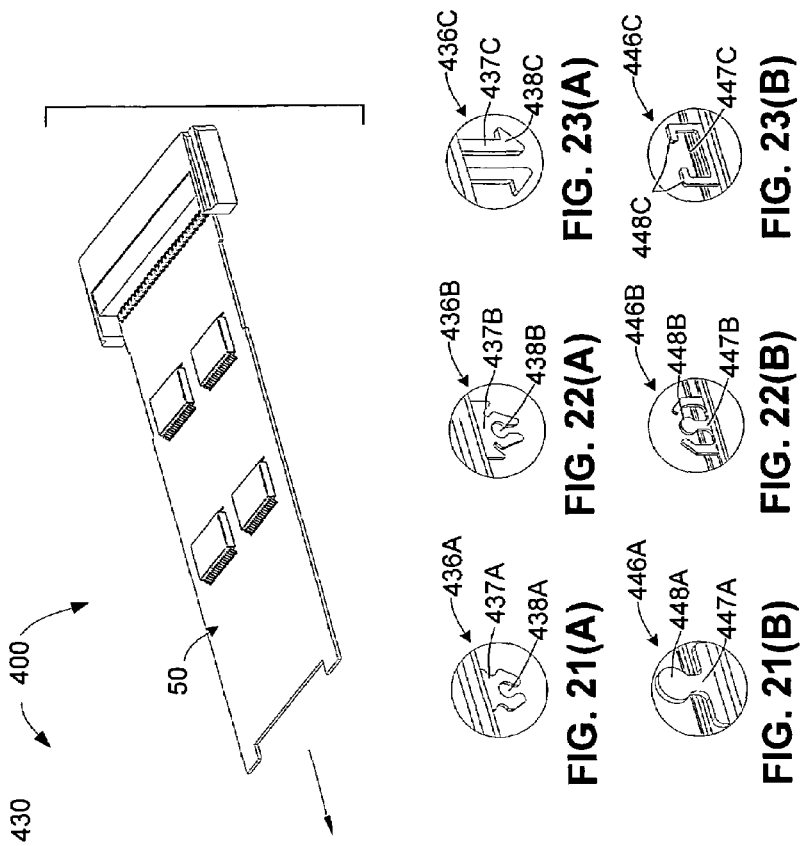
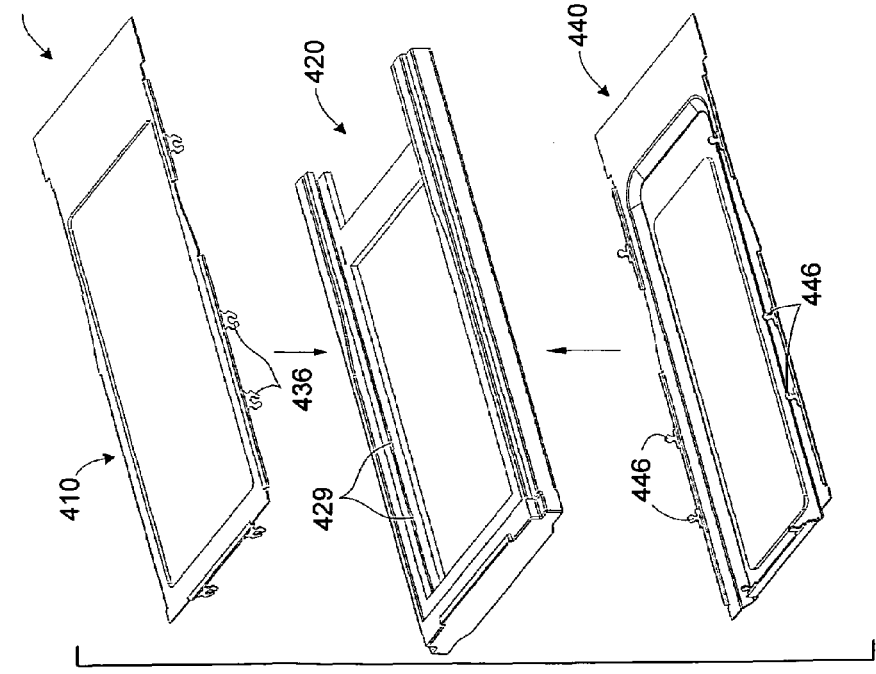

PC CARD ASSEMBLY WITH FRAME HAVING LONGITUDINAL SLOT

FIELD OF THE INVENTION

The present invention generally pertains to PC card-like devices, and more particularly to housing structures for PC cards, and to methods for assembling PC cards into such housing structures.

BACKGROUND OF THE INVENTION

Portable Computer Memory Card International Association (PCMCIA) Cards, which are now simply referred in industry as "PC cards", are credit card-size peripheral devices that are used, for example, to add memory, mass storage, and I/O capabilities to computers. PC cards includes a small printed circuit board (PCB) encased in a rugged housing, and are produced according to a variety of form factors. Each PC card typically includes a pin/socket-type connector located at one end of the housing that facilitates convenient pluggable connection of the PC card to a host system, although other connector types (e.g., surface mount) are also used. The PC card connector and data interchange formats are standardized, and mechanical and electrical standards have also been established to ensure proper connection of PC card to the host system. For example, according to one form factor, each PC card includes a standardized 68-pin connector, with each pin having a defined function.

PC card production typically involves forming a printed circuit board (PCB) assembly, and then housing the PCB assembly inside of a metal case. The PCB assembly is produced by mounting selected integrated circuit (IC) components as well as a suitable connector onto a PCB. The PCB assembly is then typically mounted into a housing using a frame kit, which typically includes a plastic frame for holding the PCB, and a pair of metal panels that mount over the frame such that the connector is exposed at one end. Unlike production of the PCB assembly, which is typically produced using well-known automated assembly systems, the process of mounting the PC card housing over the PCB assembly is typically performed manually. Utilizing conventional PC card frame kits, this manual process typically involves snapping the PCB assembly onto the plastic frame, and then connecting the metal panels either through openings formed in the frame, or around the frame such that the PCB is housed inside.

A problem associated with conventional PC cards is that the PCB can be damaged during the conventional mounting process. That is, the frames of conventional frame kits receive the PCB in a transverse direction (i.e., such that the outer periphery of the PCB is generally aligned with the outer periphery of the frame, and then the PCB is pressed against the frame until a self-locking mechanism is engaged). This conventional assembly method, which requires applying a pressing force directly onto the PCB, can result in mechanical and/or electrostatic discharge (ESD) damage to the PCB or its components, thereby reducing production yields and thus increasing production costs. In addition, the conventional manual assembly process can be tedious and time consuming, which can lead to production delays and associated increased production costs.

Another problem associated with conventional PC cards is that the transversely mounted PCBs can become dislodged from their frames and impact the housing panels when subjected to mechanical shock, such as when the PC card is accidentally dropped onto a hard surface. When dislodged from the frame, the PCB can contact the metal panels of the PC card, which can result in short circuit or mechanical damage to the components mounted on the PCB.

What is needed is a PC card frame kit that addresses the above problems associated with conventional PC cards.

SUMMARY OF THE INVENTION

The present invention is directed to a kit for assembling a PC card, to a PC card assembled using the kit, and to a method for producing a PC card using the kit that addresses the problems associated with conventional PC cards by providing a frame that defines a longitudinal slot and an open end communicating with the slot such that the PCB of a PCB assembly is slidably received into the frame, thereby minimizing handling of and damage to the PCB during the assembly process, and thus reducing overall manufacturing costs. In addition, the longitudinal slot provides a reliable structure for securing the PCB assembly inside the PC card, thereby resisting damage caused, for example, when the PC card is dropped or otherwise subjected to mechanical shock.

According to an embodiment of the present invention, a kit for assembling a PC card includes a frame, a top panel that is snap coupled to an upper portion of the frame, and a bottom panel that is snap-coupled to a bottom portion of the frame. The frame includes parallel side rails, an end rail connected across a "closed" end of the frame between the side rails, and an optional support member located adjacent to an "open" end of the frame. The side rails define portions of the longitudinal slot that communicate with the open end of the frame such that the PCB of a PCB assembly can be inserted through the open end and slid along the longitudinal slot until a leading edge of the PCB abuts the end rail and a connector structure of the PCB assembly abuts the side rails. In one embodiment, the end rail also defines an end portion of the longitudinal slot that receives the leading edge of the PCB when the PCB is fully inserted into the frame. By securing the side edges and leading edge of the PCB to the frame in this manner, both horizontal and vertical movement of the PCB is restricted, thereby avoiding damage to the PCB when the assembled PC card is subjected to mechanical shock.

After the PCB assembly is mounted onto the frame, the top and bottom panels are mounted in a transverse direction and secured to the frame to complete the PC card assembly process. In one embodiment, the frame defines an upper groove that includes portions extending along an upper surface of the side rails and the end rail, and a lower groove that includes portions extending along a lower surface of the side rails and the end rail. Each panel includes a cover plate and side walls that respectively extend from side edges of the cover plate, and an end wall that extends from an end edge of the cover plate. The panels are formed such that the side walls and end walls are received in the elongated groves formed on the upper and lower surfaces of the frame, thereby providing a durable PC card having a smooth outer surface.

According to another embodiment of the present invention, a method for producing a PC card includes generating or otherwise procuring the PC card frame kit described herein, sliding the PCB assembly into the longitudinal slot through the open end of the frame in the manner described above, and then securing the top and bottom panels to cover and protect the PCB. In one embodiment, the PCB assembly is snap-coupled or otherwise secured to the frame such that the open end of the frame abuts the connector structure of the PCB assembly. In addition, a series of through-holes are formed in the frame along the bottom surface of the groove portions, and the top and bottom panels are snap-coupled to the frame (or each other) by way of connection structures that are provided on the side and end walls of the panels, and are inserted into or through the through-holes formed in the frame.

In one embodiment of the present invention, both the top and bottom panels include substantially identical connection structures, thereby facilitating reduced manufacturing costs by allowing a single tool (e.g., a stamping press) to produce both the top and bottom panels. To facilitate connection of the identical top and bottom panels to the frame, the connection structures comprise, for example, male-type connection fingers that are connected directly to the frame (i.e., instead of passing through the frame and engaging a corresponding connection structure provided on the opposite panel). Each connection finger includes an elongated member connected to the corresponding side/end wall, and an engagement member extending from the elongated member. When the panels are mounted onto the frame, a portion of the connection finger bends to facilitate passage through the through-hole. When the engagement member clears the through-hole, the engagement member is resiliently biased to engage a portion of the frame, thereby securing the panel to the frame in a permanent manner (i.e., such that removal of the panel would necessarily permanently damage the connection finger and/or frame). Because the frame is made from an electrically insulating material, and because the male-type connection fingers remain separated, the upper and lower panels are electrically isolated from each other when the connection fingers are connected directly to the frame. According to an alternative embodiment of the invention, a pair of grounding contacts are provided on opposite sides of the PCB assembly connector that contact the upper and lower panels, and the grounding contacts are connected to an associated pin (or separate pins) of the connector, thereby preventing ESD damage to the PCB during handling and installation. In another embodiment, a metal shroud (support) is provided in the frame that engages the connection fingers, thereby electrically connecting the upper and lower panels.

According alternative embodiments of the present invention, the top and bottom panels are formed with male/female and/or self-engaging connection structures that facilitate convenient and low cost connection of the panels to the frame during the PC card assembly process. In one embodiment, three-dimensional male-female connection members are utilized that engage when the top and bottom panels are mounted on the frame. In another embodiment, the additional bending step needed to form the three-dimensional female-type connection members is avoided by providing several two-dimensional self-engaging connection structures.

BRIEF DESCRIPTION OF THE DRAWINGS

These and other features, aspects and advantages of the present invention will become better understood with regard to the following description, appended claims, and accompanying drawings, where:

FIG. 1 is an exploded perspective view showing a PC card frame kit and PCB assembly that are combined to form a PC card according to an embodiment of the present invention;

FIG. 2 is a perspective view showing the fully assembled PC card produced using the components of FIG. 1;

FIG. 3 is a top plan view showing a frame utilized in the PC card shown in FIG. 1;

FIG. 4 is a cross-sectional end view taken along section line 4—4 of FIG. 3;

FIG. 5 is a cross-sectional side view taken along section line 5—5 of FIG. 3;

FIG. 6 is a flow diagram showing a method for producing a PC card according to another embodiment of the present invention;

FIG. 7 is a partial exploded perspective view showing a male-type connection finger and a corresponding through-hole according to an embodiment of the present invention;

FIGS. 8(A), 8(B), and 8(C) are partial cross-sectional side views showing the connection finger of FIG. 7 during connection of a panel to the frame according to an embodiment of the present invention;

FIG. 9 is a partial exploded perspective view showing a male-type connection finger and a corresponding through-hole according to another embodiment of the present invention;

FIG. 10 is a partial exploded perspective view showing a male-type connection finger and a corresponding through-hole according to another embodiment of the present invention;

FIG. 11 is a partial exploded perspective view showing a male-type connection finger and a corresponding through-hole according to yet another embodiment of the present invention;

FIG. 12 is a partial exploded perspective view showing a PCB assembly connector including upper and lower grounding contact structures according to another embodiment of the present invention;

FIGS. 13(A) and 13(B) are partial cross-sectional side views showing upper and lower panels being mounted against the grounding contact structures of FIG. 12;

FIG. 16 is an exploded perspective view showing a PC card frame kit and PCB assembly associated with a PC card according to another embodiment of the present invention;

FIGS. 17(A), 17(B), and 17(C) are perspective views showing three-dimensional (3D) connection members utilized by the PC card shown in FIG. 16;

FIGS. 18(A), 18(B), and 18(C) are perspective views showing 3D connection members according to another embodiment of the present invention;

FIGS. 19(A), 19(B), and 19(C) are perspective views showing 3D connection members according to another embodiment of the present invention;

FIG. 20 is an exploded perspective view showing a PC card frame kit and PCB assembly for forming a PC card according to another embodiment of the present invention;

FIGS. 21(A), 21(B), and 21(C) are perspective views showing two-dimensional (2D) connection members utilized by the PC card kit shown in FIG. 20;

FIGS. 22(A), 22(B), and 22(C) are perspective views showing 2D connection members according to another embodiment of the present invention; and FIGS. 23(A), 23(B), and 23(C) are perspective views showing 2D connection members according to another embodiment of the present invention.

DETAILED DESCRIPTION OF THE DRAWINGS

Figure 14:
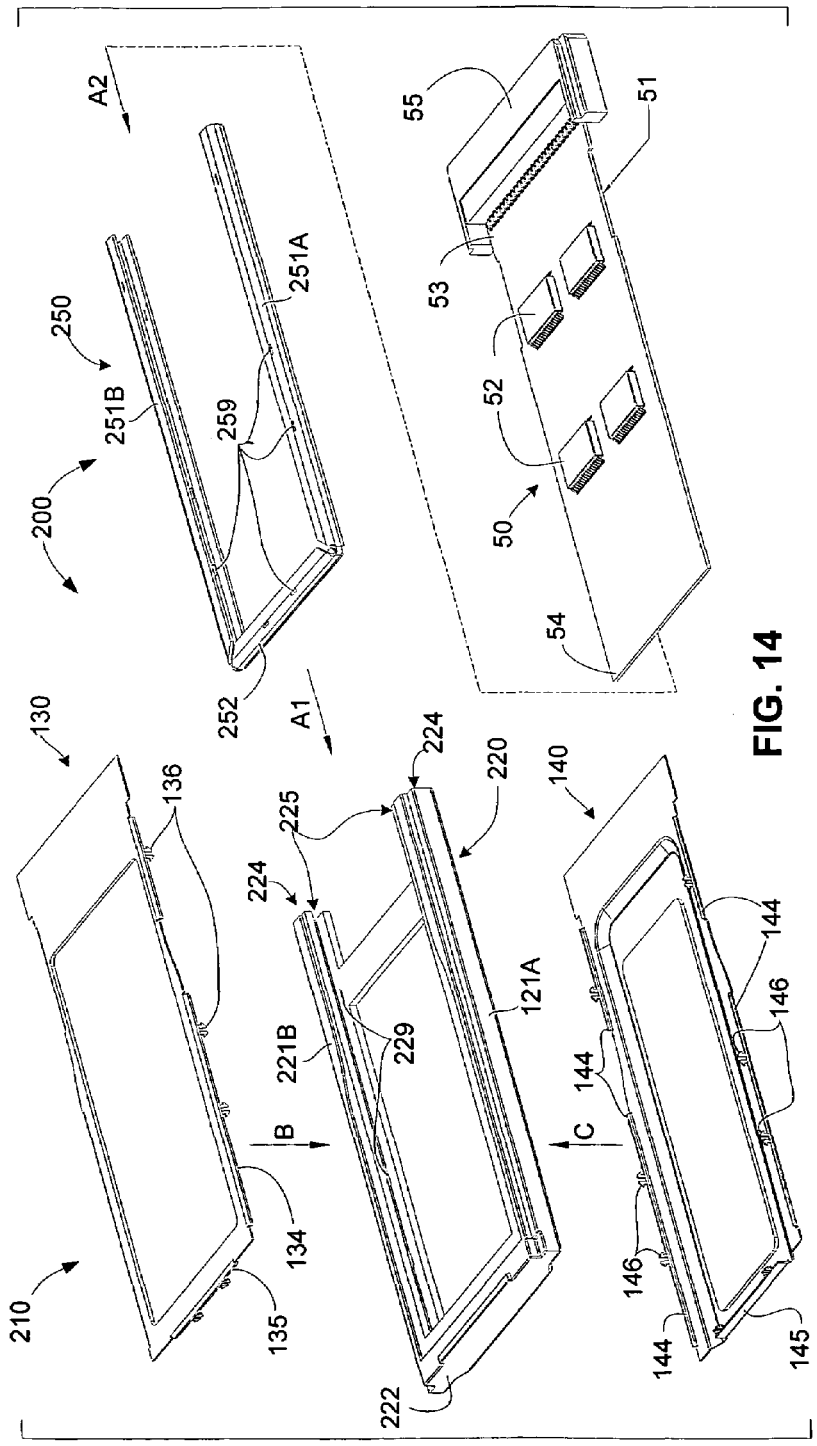
FIG. 14 is an exploded perspective view showing a PC card frame kit and PCB assembly associated with a PC card according to another embodiment of the present invention.

FIGS. 1 and 2 are exploded perspective and assembled perspective views, respectively, showing a PC card 100 formed by a PCB assembly 50 and a PC card frame kit 110 according to an embodiment of the present invention.

Referring to the right side of FIG. 1, PCB assembly 50 generally includes a PCB 51 and a connector 55. PCB 51 is sized and constructed according to a predefined form factor (e.g., consistent with the PCI Express Architecture developed by Intel Corp. of Santa Clara, Calif.), and includes one or more ICs 52 and/or other electronic components mounted thereon. Connector 55, which also conforms to the selected form factor, is mounted onto a back edge 53 of PCB 51, and includes pins (not shown) that communicate with ICs 52 via corresponding traces (also not shown) formed on PCB 51 according to well-known practices. PCB 51 also includes a leading (first) edge 54 that is inserted into frame 120 in the manner described below.

Referring to the left side of FIG. 1, PC card frame kit 110 includes a frame 120, a top panel 130, and a bottom panel 140. As described in additional detail below, frame 120, top panel 130 and bottom panel 140 are connected (assembled) with PCB assembly 50 to form a housing that protects PCB 51. Frame 120 is molded from a non-conductive material (e.g., plastic) and supports PCB 51 in the manner described below. Top panel 130 and bottom panel 140 are stamped or otherwise formed from a suitably rigid material (e.g., sheet metal), and are respectively secured to the upper and lower surfaces of frame 120. Top panel 130 includes a substantially flat (planar) cover plate 131 having front edge 132 and a back edge 133. The side edges of wall 131 are bent downward (i.e., substantially perpendicular to the plane defined by cover plate 131) to form side walls 134, and front edge 132 is bent downward to form an end wall 135. Extending from side walls 134 and end wall 135 are connection fingers 136 that secure top panel 130 to frame 120 in the manner described below. Cover plate 131 also defines an optional recession 139 that is provided for clearance and/or rigidity and/or labeling. Similar to top panel 130, bottom panel 140 includes a substantially flat (planar) cover plate 141 having front edge 142 and a back edge 143, with side edges of wall 141 bent downward to form side walls 144, and front edge 142 bent downward to form an end wall 145. Connection fingers 146 extend from side walls 144 and end wall 145, and cover plate 141 also defines an optional recession 149.

Referring to the center of FIG. 1, frame 120 generally includes parallel side rails 121A and 121B (collectively referred to as side rails 121) and an end rail 122. End rail 122 extends between and rigidly connects front edges of side rails 121, and forms a closed end 123 of frame 120. Frame 120 also defines an open end 124 at the end of side rails 121 that is opposite to end rail 122, and side rails 121 define a longitudinal slot 125 that extends along side rails 121 and communicates with open end 124 such that PCB 51 can be slidably inserted into slot 125 in the manner described in additional detail below. An optional PCB support 126 extends between side rails 121 adjacent to open end 124, and is positioned below the plane defined by longitudinal slot 125. Formed on an upper surface of side rails 121 and end rail 122 is an elongated groove 127 for receiving side walls 134 and end wall 135 of top panel 130 in the manner described in additional detail below. A similar elongated groove (not shown) is formed on a lower surface of side rails 121 and end rail 122 for receiving side walls 144 and end wall 145 of bottom panel 140.

FIG. 2 shows PC card 100 after PCB assembly 50 slidably received in frame 120 of frame kit 110 in the longitudinal direction (indicated by arrow A in FIG. 1), and panels 130 and 140 of frame kit 110 are mounted onto frame 120 in transverse directions (indicated by arrows B and C in FIG. 1). Note that when PCB assembly 50 is fully inserted into frame 120 and panels 130 and 140 are mounted thereon, connector 55 abuts open end 124 of side rails 121, and the back edges of panels 130 and 140 (e.g., back edge 133) overlap frame 120 and connector 55, thereby providing a protective housing that seals PCB 51 (FIG. 1) inside.

FIG. 3 is a top plan view showing frame 120 in additional detail, and FIGS. 4 and 5 are cross sectional side views taken along section lines 4—4 and 5—5, respectively, which are shown in FIG. 3. As discussed above and shown again in FIG. 3, frame 120 includes parallel side rails 121A and 121B connected at a closed end 123 by end rail 122, and includes a PCB support 126 located adjacent to an open end 124. FIG. 4 shows an exemplary cross-section of side rails 121A and 121B, and depicts top panel 130 and bottom panel 140 respectively located above and below frame 120 in a position suitable for connection with frame 120. Similarly, FIG. 5 shows an exemplary cross-section of end rail 122, and also shows top panel 130 and bottom panel 140.

As indicated in FIGS. 4 and 5, longitudinal slot 125 is defined by side rails 121A and 121B, and is located in an X-Y plane extending across a central region of frame 120 between side rails 121A and 121B. In particular, as indicated on the left side of FIG. 4, side rail 121A defines a slot portion 125A that receives a side edge of the PCB when PCB assembly 50 (FIG. 1) is inserted into frame 120. Referring to the right side of FIG. 4, side rail 121B defines a slot portion 125B that receives a second side edge of the PCB when PCB assembly 50 (FIG. 1) is inserted into frame 120. Similarly, FIG. 5 indicates that end rail 122 defines an end portion 125C of longitudinal slot 125 that receives a leading edge of the PCB. By providing precisely cut slot portions 125A, 125B, and 125C (shown in FIGS. 4 and 5), the PCB is securely held within frame 120 to minimize the possibility of circuit short due to contact with top panel 130 or bottom panel 140. That is, by securing the side and leading edges of the PCB in this manner, the PCB is securely held in longitudinal slot 125 between panels 130 and 140 such that both horizontal and vertical movement of the PCB (i.e., in the directions indicated by X, Y, and Z arrows in FIGS. 4 and 5) are restricted, thereby avoiding damage to the PCB when the assembled PC card is subjected to mechanical shock (e.g., by dropping onto a hard surface). Note that in one embodiment an insulation layer is also attached by glue onto the inside surface of metal cover plates 131 and 141 to reduce the risk of circuit short. Alternatively, a non-conductive coating or painting may be applied as well to perform the same function.

FIG. 6 is a flow diagram showing a simplified method for producing a PC card utilizing the PC card frame kit described above. Referring to the upper portion of FIG. 6, upon assembling and pre-testing a PCB assembly (block 160), and producing or otherwise procuring a frame consistent with the frame structures described herein (block 161) and top and bottom panels consistent with the panel structures described herein (block 162), the method includes inserting a leading edge of the PCB of the PCB assembly into open end of the frame (block 164), and then sliding the PCB assembly along the longitudinal slot and securing the PCB assembly to the frame (block 166). Referring briefly back to FIG. 1, the correct orientation of PCB assembly 50 relative to frame 120 is shown, and insertion/sliding takes place in the direction indicated by arrow A. With the leading edge 54 inserted through open end 124, PCB assembly is pushed in the direction of arrow A such that the edges of PCB 51 slide along slot portions 125A and 125B (shown in FIG. 4). When fully inserted, leading edge 54 of PCB 51 enters slot portion 125C (FIG. 5), and connector 55 contacts open end 124 of side rails 121 (as indicated in FIG. 2). A suitable self-locking mechanism (e.g., snap-coupling between frame 120 and PCB 51 and/or connector 55) may be used to secure frame 120 to PCB assembly 50. Note that this assembly process can be manually executed by holding frame 120 in one hand, and holding PCB assembly 50 by connector 55 in the other hand, thereby avoiding damage to PCB 51 that can occur using conventional assembly methods.

Referring to the bottom of FIG. 6, after PCB assembly 50 is inserted and secured to frame 120, the top and bottom panels are mounted and secured onto upper and lower surfaces of frame 120 to cover and protect the PCB mounted therein (block 168). As indicated in FIGS. 3 through 5, the process of mounting top panel 130 onto frame 120 involves aligning side walls 134 of top panel 130 with side groove portions 127A and 127B, which are respectively formed along side rails 121A and 121B, and aligning end wall 135 with end groove portion 127C formed along end rail 122. When pressed down onto frame 120, side walls 134 enter groove portions 127A and 127B, thereby forming a smooth, seamless outer housing that resists subsequent removal of panel 130. Similarly, as indicated in FIGS. 4 and 5, mounting bottom panel 140 onto frame 120 involves aligning side walls 144 with side groove portions 128A and 128B, which are respectively formed along the bottom surfaces of side rails 121A and 121B, and aligning end wall 145 with end groove portion 128C formed along the bottom surface of end rail 122.

According to an aspect of the present embodiment, a series of through-holes 129 (see, e.g., FIG. 3) are formed in frame 120 along the bottom surface of peripheral groove portions 127A, 127B, and 127C, and top panel 130 is provided with connection fingers 136 that are inserted into through-holes 129 when top panel 130 is secured onto frame 120. Similarly, through-holes are also formed on the lower surface of frame 120 along groove portions 128A, 128B, and 128C, and bottom panel 140 includes connection fingers 146 that are inserted into these through-holes 129 when bottom panel 140 is secured onto frame 120. These connection fingers and through-holes facilitate convenient mounting of the panels by acting as guides to align the panel walls with the frame grooves. In addition, as described in accordance with the various embodiments disclosed below, the connection fingers provide structures that automatically snap-couple the panels to the frame (or another structure), and serve to permanently connect the panels to the frame; that is, upon pressing the panels onto the frame, the connection fingers automatically engage either a portion of the frame (or another structure) such that subsequent removal of the panel causes permanent damage to the connection fingers and/or to the frame structure. This permanent damage facilitates easy identification of PC cards that have been disassembled, thereby reducing security risks due to tampering with the PC card electronics.

According to an embodiment of the present invention, both top panel 130 and bottom panel 140 include substantially identical (e.g., male-type) connection structures (e.g., connection fingers 136 and 146) that are snap-coupled directly to frame 120 (i.e., not to a corresponding female connector of the opposite panel). By providing substantially identical connection structures, both the top and bottom panel can be produced using the same stamping machine such that top panel 130 and bottom panel 140 are interchangeable), thereby reducing manufacturing costs because only a single tool (e.g., a stamping press) to produce both top panel 130 and bottom panel 140. In contrast, when different connection structures (e.g., male-type on a top panel and female-type on a bottom panel that engage when both panels are mounted onto the frame), two different stamping presses are required, which increases production costs.

FIG. 7 is a partial exploded perspective view showing a portion of top panel side wall 134 including male-type connection finger 136A, and a corresponding portion of frame side rail 121 including through-hole 129 according to an embodiment of the present invention. As described above, connection finger 136A extends downward from a lower edge of side wall 134, and through-hole 129 is formed in the bottom surface of groove 127. Connection finger 136A includes an elongated member 137A connected to the corresponding side/end wall (e.g., side wall 134), and an engagement member 138A extending from elongated member 137A.

FIGS. 8(A) through 8(C) are simplified cross-sectional side views showing connection finger 136A during connection of top panel 130 (e.g., wall 134) to the frame 120. As indicated in FIG. 8(A), top panel 130 positioned over frame 120 such that connection structure 136A is positioned over corresponding through-hole 129. Next, as indicated in FIG. 8(B), as top panel 130 is pressed against frame 120, engagement member 138A contacts and is deflected by edges 121-1 of through-hole 129, thereby causing elongated member 137A to resiliently bend as indicated. Referring to FIG. 8(C), once engagement member 138A has cleared the lower end of through-hole 129, elongated member 137A resiliently returns to its original (straight) shape, thereby biasing engagement member 138A to engage a portion 121-2 of the frame and securing top panel 130 to frame 120 in a permanent manner (i.e., such that removal of top panel 130 would necessarily permanently damage connection finger 136A and/or portion 121-2 of frame 120). Connection finger 136A and top panel 130 thus provide a sturdy structure for producing PC cards. Note that the description associated with connection finger 136 is substantially identical to that associated with connection finger 146 of lower panel 140, which is omitted herein for brevity.

FIGS. 9, 10, and 11 show alternative male-type connection structures that can be utilized in place of connection finger 136A (FIG. 7). FIG. 9 shows a portion of top panel side wall 134 including male-type connection finger 136B, which includes an elongated member 137B connected to side wall 134, and an two-part engagement member 138B that is bent inward from elongated member 137B. FIG. 10 shows another male-type connection finger 136C, which includes an elongated member 137C connected to side wall 134, and a series of teeth-like engagement members 138C formed along an edge of elongated member 137C. Finally, FIG. 11 shows another male-type connection finger 136D including an elongated member 137D connected to side wall 134, and a central tab-like engagement members 138D extending inward from elongated member 137D. The various male-type connection structures shown in FIGS. 7–10 are intended to be exemplary and not limiting. Further, those skilled in the art will recognize that other connection structures (e.g., female-type structures that receive male structures extending from frame 120) may also be used.

As described above, frame 120 is formed from an electrically insulating material (e.g., plastic) to facilitate operation of PCB 51. Because the frame is non-conducting, and because the male-type connection fingers described above with reference to FIGS. 7–10 remain separated (i.e., connected only to frame 120), upper panel 130 and lower panel 140 remain electrically isolated from each other. A problem that can arise from having top panel 130 electrically isolated from bottom panel 140 is possible ESD damage during handling and installation.

FIGS. 12, 13(A) and 13(B) show another embodiment of the present invention that addresses the potential ESD problem associated with electrically isolated top and bottom panels. Referring to FIG. 12, according to the present embodiment, the PCB assembly of a PC card is modified to include a first grounding contact 56 exposed on an upper surface of connector 55 and connected to a first grounding pin 57, and a second grounding contact 58 exposed on a lower surface of connector 55 and connected to a second grounding pin 59 (or to a common grounding pin). As indicated in FIGS. 13(A) and 13(B), grounding contact 56 is arranged such that when top panel 130 is mounted onto frame 120 as described above, a portion of cover plate 131 located adjacent to front edge 133 is brought into contact with ground contact 56, thereby facilitating the discharge of static electricity via pin 57 when the PC card is subsequently installed into an electronic system. Similarly, grounding contact 58 is arranged such that when bottom panel 140 is mounted, a portion of cover plate 141 located adjacent to front edge 143 is brought into contact with ground contact 58, thereby facilitating the discharge of static electricity via pin 59.

Figure 15:
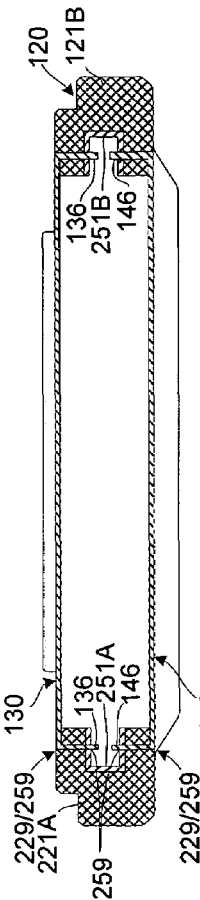
FIG. 15 is a cross-sectional side view showing a portion of the PC card of FIG. 14.

FIG. 14 is an exploded perspective view showing a PC card 200 utilizing a frame kit 210 according to another embodiment of the present invention. PC card 200 is similar to PC card 100 (described above) in that PCB assembly 50, top cover 130, and bottom cover 140 are utilized in substantially the same form as described above. However, PC card frame kit 210 includes a metal support (shroud) 250 that is received in the slot portions of a frame 220 to increase structural strength and to provide electrical interconnection between upper plate 130 and lower plate 140. Similar to frame 220, metal support 250 includes first and second parallel side arms 251A and 251B, and an end arm 252 that extends between side arms 251A and 251B. As indicated in FIG. 15 (which omits the PCB assembly for clarity), side arms 251A and 251B are shaped to be received into corresponding slot portions formed in the side rails 221A and 221B of frame 220. In addition, metal support 250 defines several through-holes 259 that are aligned with through-holes 229 of frame 220 to receive and engage with connection fingers 136 of top panel 130 and connection fingers 146 of bottom panel 140 in the manner described above, whereby metal support 250 provides electrical connection between top panel 130 and bottom panel 140. Note that, in alternative embodiments, metal support 250 is either inserted into frame 220 (e.g., as indicated by arrow A1) before PCB assembly 50 is inserted, or PCB assembly 50 is inserted into metal support 250 (e.g., as indicated by arrow A2), and then the combined PCB assembly/metal support structure is inserted into frame 220. In either case, top panel 130 and bottom panel 140 are mounted onto frame 220 (indicated by arrows B and C) after PCB assembly 50 and metal support 250 are mounted onto frame 220. In another possible embodiment, metal support 250 is inserted into a mold during the plastic injection molding process utilized to fabricate frame 220, thereby forming a frame with a built-in (integrated) metal support.

Although the present invention is described above with reference to panel structures having substantially identical (e.g., male-type) connection structures, certain aspects of the present invention may be included in PC cards utilizing male/female and/or self-locking connection structures that facilitate convenient and low cost connection of the panels to the frame during the PC card assembly process.

FIG. 16 is an exploded perspective view showing a PC card 300 including PCB assembly 50 (discussed above) and a frame kit 310 including a frame 320, a top panel 330, and a bottom panel 340. Frame kit 310 differs from the embodiments described above in that top cover 330 and bottom cover 340 include complementary male-female connection structures 336 and 346 in which at least one of the connection structures is bent into a three-dimensional (3D) shape. Frame 320 is formed substantially as described above but includes through-holes 329 that allow connection structures 336 and 346 to pass through and engage each other.

FIGS. 17(A)–(C), 18(A)–(C), and 19(A)–(C) show male/female connection structures that can be utilized in on top panel 330 and bottom panel 340 according to alternative embodiments of the present invention. FIG. 17(A) shows a male-type connection finger 336A, which includes an elongated member 337A and an engagement member 338A that is mounted on an end of elongated member 337A, and FIG. 17(B) shows a female-type connection finger 346A, which includes a base member 347A defining an opening 348A for receiving male-type connection finger 336A in the manner indicated in FIG. 17(C). FIG. 18(A) shows a male-type connection finger 336B, which includes an elongated member 337B and an engagement member 338B that is mounted on an end of elongated member 337B, and FIG. 18(B) shows a female-type connection finger 346B, which includes a base member 347B defining an opening 348B for receiving male-type connection finger 336B in the manner indicated in FIG. 18(C). FIG. 19(A) shows a first connection finger 336C (which is similar to that described above with reference to FIG. 9), which includes an elongated member 337C including a two-part engagement member 338C that is mounted on an end of elongated member 337C, and FIG. 19(B) shows a second connection finger 346C, which is similar to connection finger 336C, and includes a base member 347C and a two-part engagement member 348C that is mounted on an end of elongated member 347C. First and second connection fingers 336C and 346C engage as indicated in FIG. 19(C).

FIG. 20 is an exploded perspective view showing a PC card 400 including PCB assembly 50 (discussed above) and a frame kit 410 including a frame 420, a top panel 430, and a bottom panel 440. Frame kit 410 differs from the embodiments described above in that top cover 430 and bottom cover 440 include complementary self-engaging connection structures 436 and 446 in which both complementary structures are formed in a two-dimensional (2D) shape, thereby avoiding the additional bending step required to form the 3D connection structures described above with reference to FIGS. 17–19. Frame 420 is formed substantially as described above but includes through-holes 429 that allow connection structures 436 and 446 to pass through and engage each other.

FIGS. 21(A)–(C), 22(A)–(C), and 23(A)–(C) show complementary 2D self-engaging connection structures that can be utilized in on top panel 430 and bottom panel 440 according to alternative embodiments of the present invention. FIG. 21(A) shows a first connection structure 436A, which includes an base member 437A defining an engagement region 438A, and FIG. 21(B) shows a complimentary connection structure 446A, which includes a base member 447A having a tab 448A extending therefrom that self-engages with connection structure 436A in the manner indicated in FIG. 21(C) when top panel 430 and bottom panel 440 are mounted onto frame 420 (FIG. 20). FIG. 22(A) shows another first connection structure 436B, which includes an base member 437B defining an engagement region 438B, and FIG. 22(B) shows a complimentary connection structure 446B, which includes a base member 447B having a tab 448B extending therefrom that self-engages with connection structure 436B in the manner indicated in FIG. 22(C). Finally, FIG. 23(A) shows a male-type connection finger 436C, which includes an elongated member 437C and an engagement member 438C that is mounted on an end of elongated member 437C, and FIG. 23(B) shows a 2D female-type connection structure 446C, which includes a 2D frame 448C defining an opening 447C for receiving male-type connection finger 436C in the manner indicated in FIG. 23(C).

Although the present invention has been described with respect to certain specific embodiments, it will be clear to those skilled in the art that the inventive features of the present invention are applicable to other embodiments as well, all of which are intended to fall within the scope of the present invention. For example, although the present invention has been described with specific reference to PC cards, those skilled in the art will recognize that the structures and methods associated with the present invention can also be used in structures similar to those of PC cards (i.e., a PCB-based circuit housed in a metal casing and connected to a host system via a connector). Accordingly, the appended claims are directed to all such PC card-like structures, such as some solid state hard drives and compact flash cards.

The invention claimed is:

1. A PC card frame kit for housing a printed circuit board assembly (PCBA) including a printed circuit board (PCB) and a connector mounted on a back edge of the PCB, the frame kit comprising:
a frame including first and second parallel side rails and an end rail extending between first ends of the first and second side rails,
wherein the frame defines an open end located at second ends of the first and second side rails,
wherein the first and second side rails define a longitudinal slot for slidably receiving the PCB of the PCBA,
wherein the frame defines an elongated first groove including portions extending along a first surface of at least one of the first and second side rails,
wherein the frame kit further comprises a first panel including a cover plate and side walls respectively extending from opposite side edges of the cover plate, and
wherein the side walls are arranged to fit within the portions of the elongated first groove when the first panel is mounted onto the frame.

2. The PC card frame kit according to claim 1, wherein each of the first and second side rails defines a side portion of the longitudinal slot for receiving side edges of the PCB when the PCB is fully inserted into the frame.

3. The PC card frame kit according to claim 1, wherein the end rail defines an end portion of the longitudinal slot for receiving a front edge of the PCB when the PCB is fully inserted into the frame.

4. The PC card frame kit according to claim 1,
wherein the frame further comprises a plurality of through-holes formed in the elongated first groove,
wherein the first panel further comprises a plurality of connection fingers extending from each of the side walls, and
wherein the connection fingers are arranged such that each connection finger extends into a corresponding through-hole when the first panel is mounted onto the frame.

5. The PC card frame kit according to claim 4, wherein each connection finger comprises an elongated member having a first end connected to a corresponding side wall, and an engagement member extending from the elongated member, wherein the engagement member is disposed to fixedly engage a portion of the frame when the first panel is mounted onto the frame and said each connection finger is inserted into a corresponding through-hole.

6. The PC card frame kit according to claim 1,
wherein an end portion of the elongated first groove extends along an upper surface of the end rail,
wherein the first panel further comprises an end wall extending from an end edge of the cover plate, and
wherein the end wall is arranged to fit within the end portion of the first groove when the first panel is mounted onto the frame.

7. The PC card frame kit according to claim 1,
wherein the frame further defines elongated second groove including portions extending along a second surface of at least one of the first and second side rails,
wherein the frame kit further comprises a second panel including a cover plate and side walls respectively extending from opposite side edges of the cover plate, and
wherein the side walls are arranged to fit within the elongated second groove when the second panel is mounted onto the frame.

8. The PC card frame kit according to claim 7, wherein the frame is formed from an electrically insulating material, and wherein the first and second panels are mounted to the frame such that the first panel is electrically isolated from the second panel.

9. The PC card frame kit according to claim 7, wherein the first and second panels comprise connection fingers, wherein each connection finger comprises an elongated member having a first end connected to the associated side wall, and an engagement member extending from the resilient member, wherein the engagement member is disposed to fixedly engage a portion of the frame when the first and second panels are mounted onto the frame and said each connection finger is inserted into a corresponding through-hole defined in the frame.

10. The PC card frame kit according to claim 9, further comprising a metal support having first and second side arms arranged to be received into corresponding slot portions formed in the first and second side rails of the frame, wherein the metal support includes a plurality of through-holes arranged to engage connection fingers of the first and second panels, whereby the metal support electrically connects the first and second panels.

11. The PC card frame kit according to claim 7, wherein the first panel comprises a male-type connection structure and the second panel comprises a female-type connection structure, and wherein the frame comprises a through-hole positioned such that the male-type connection structure extends through the through-hole and engages the female-type engagement structure when the first and second panels are mounted onto the frame.

12. The PC card frame kit according to claim 7, wherein the first panel comprises a first self-locking connection structure and the second panel comprises a second self-locking connection structure, and wherein the frame comprises a through-hole positioned such that at least one of the first and second connection structures extends through the through-hole when the first and second panels are mounted onto the frame, and wherein the first and second self-locking structures are constructed to self-engage when the first and second panels are mounted onto the frame.

13. A PC card comprising:
  a printed circuit board assembly (PCBA) including a printed circuit board (PCB) having a front edge and a back edge, and a connector mounted onto the back edge of the PCB;
  a frame including first and second parallel side rails and an end rail extending between first ends of the first and second side rails,
  wherein the frame defines an open end located at second ends of the first and second side rails,
  wherein the first and second side rails define a longitudinal slot,
  wherein the PCBA is mounted in the frame such that the connector abuts the open end of the frame, and the PCB extends through the open end of the frame into the longitudinal slot,
  wherein the frame defines an elongated first groove including portions extending along a first surface of at least one of the first and second side rails,
  wherein the PC card further comprises a first panel including a cover plate and side walls respectively extending from opposite side edges of the cover plate, and
  wherein the side walls are engaged within the portions of the elongated first groove.

14. The PC card according to claim 13,
  wherein the first side rail defines a first slot portion of the longitudinal slot,
  wherein the second side rail defines a second slot portion of the longitudinal slot, and
  wherein side edges of the PCB are engaged in the first and second slot portions.

15. The PC card according to claim 13, wherein the end rail defines an end portion of the longitudinal slot, and wherein a front edge of the PCB is engaged in the end portion.

16. The PC card according to claim 13,
  wherein the frame further comprises a plurality of through-holes formed in the elongated first groove,
  wherein the first panel further comprises a plurality of connection fingers extending from each of the side walls such that each connection finger extends into a corresponding through-hole.

17. The PC card according to claim 16, wherein each connection finger comprises an elongated member having a first end connected to a corresponding side wall, and an engagement member extending from the elongated member and fixedly engaged to a portion of the frame.

18. The PC card according to claim 13,
  wherein an end portion of the elongated first groove extends along an upper surface of the end rail,
  wherein the first panel further comprises an end wall extending from an end edge of the cover plate and received in the end portion of the first groove.

19. The PC card according to claim 13,
  wherein the frame further defines elongated second groove including portions extending along a second surface of at least one of the first and second side rails,
  wherein the PC card further comprises a second panel including a cover plate and side walls respectively extending from opposite side edges of the cover plate, and
  wherein the side walls are received into the elongated second groove of the frame.

20. The PC card according to claim 19, wherein the frame is formed from an electrically insulating material, and wherein the first and second panels are mounted to the frame such that the first panel is electrically isolated from the second panel.

21. The PC card according to claim 20, wherein the connector of the PCBA includes a first grounding contact disposed to contact the first panel, and a second grounding contact disposed to contact the second panel.

22. The PC card according to claim 21, wherein the first grounding contact is connected to a first pin located in the connector, and the second grounding contact is connected to a second pin located in the connector.

23. The PC card according to claim 19, wherein the first and second panels comprise connection fingers, wherein each connection finger comprises an elongated member having a first end connected to the associated side wall, and an engagement member extending from the resilient member, wherein the engagement member is fixedly engaged to the frame.

24. The PC card according to claim 23, further comprising a metal support having first and second side arms arranged to be received into corresponding slot portions formed in the first and second side rails of the frame, wherein the metal support includes a plurality of through-holes engaged with connection fingers of the first and second panels, whereby the metal support electrically connects the first and second panels.

25. The PC card according to claim 19, wherein the first panel comprises a male-type connection structure and the second panel comprises a female-type connection structure, and wherein the frame comprises a through-hole positioned such that the male-type connection structure extends through the through-hole and engages the female-type connection structure.

26. The PC card according to claim 19, wherein the first panel comprises a first self-locking connection structure and the second panel comprises a second self-locking connection structure, and wherein the frame comprises a through-hole positioned such that at least one of the first and second connection structures extends through the through-hole, and wherein the first and second self-locking structures are constructed to self-engage when the first and second panels are mounted onto the frame.

* * * * *